United States Patent
Uchiki et al.

(10) Patent No.: US 6,617,881 B2
(45) Date of Patent: Sep. 9, 2003

(54) SEMICONDUCTOR INTEGRATED CIRCUIT

(75) Inventors: Hideki Uchiki, Tokyo (JP); Harufusa Kondoh, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/051,054

(22) Filed: Jan. 22, 2002

(65) Prior Publication Data

US 2003/0001619 A1 Jan. 2, 2003

(30) Foreign Application Priority Data

Jun. 28, 2001 (JP) ........................................ 2001-196425

(51) Int. Cl.[7] .......................................... H03K 19/0175
(52) U.S. Cl. .............................. 326/86; 326/83; 326/90; 326/82; 326/30; 327/108
(58) Field of Search ............................. 326/83, 86, 90, 326/23, 24, 26, 27; 327/108

(56) References Cited

U.S. PATENT DOCUMENTS 5,111,080 A * 5/1992 Mizukami et al. ............ 326/30
5,471,498 A * 11/1995 Kuo ............................ 375/295
6,025,742 A * 2/2000 Chan ........................... 327/108
6,313,662 B1 * 11/2001 Ide ............................... 326/83

FOREIGN PATENT DOCUMENTS

JP 62-231521 10/1987
JP 63-62413 3/1988

* cited by examiner

*Primary Examiner*—Michael Tokar
*Assistant Examiner*—Vibol Tan
(74) *Attorney, Agent, or Firm*—Burns, Doane, Swecker & Mathis, LLP

(57) ABSTRACT

A driver circuit generates two control signals that change from low to high as an input signal changes from high to low, and change from high to low as the input signal changes from low to high. The driver circuit also generates another two control signals that change from high to low as the input signal changes from high to low, and change from low to high as the input signal changes from low to high. The driver circuit applies these four control signals to gate terminals of four MOS transistors. Timings of logical level changes of these four control signals are controlled so as to generate a period in which the four MOS transistors are simultaneously turned on or off.

7 Claims, 6 Drawing Sheets

FIG. 1

PRIOR ART

FIG. 2

PRIOR ART

SEMICONDUCTOR INTEGRATED CIRCUIT

FIELD OF THE INVENTION

The present invention relates to a semiconductor integrated circuit that forms a differential output circuit for outputting signals to another semiconductor integrated circuits.

BACKGROUND OF THE INVENTION

Figure 1:
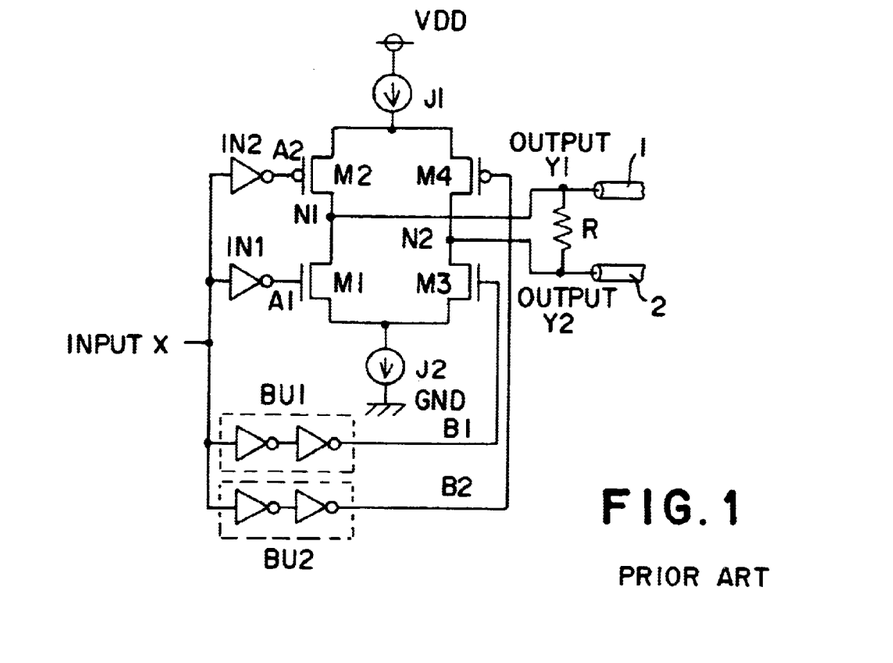
FIG. 1 is a block circuit diagram showing a differential output circuit based on the conventional art.

FIG. 1 shows a differential output circuit based on the conventional art. This differential output circuit comprises two n-channel MOS transistors (hereafter called nMOS transistor) M1 and M3, two p-channel MOS transistors (hereafter called pMOS transistor) M2 and M4, two constant current sources J1, J2, and drivers IN1, IN2, BU1, and BU2. The drivers IN1, IN2, BU1, and BU2 receive a common input signal X to generate control signals A1, A2, B1, and B2 to be applied to respective gate electrodes of the MOS transistors M1 to M4. When the input signal X is at a low level (hereafter called L level), the transistors M1 and M4 are turned on, while the transistors M2 and M3 are turned off. Conversely, when the input signal X is at a high level (hereafter called H level), the transistors M1 and M4 are turned off, while the transistors M2 and M3 are turned on. Accordingly, logical signals Y1 and Y2 in opposite phases to each other are output from nodes N1 and N2, respectively.

The output signals Y1 and Y2 are transferred to circuits of another semiconductor chip through respective transmission paths 1 and 2. A resistor R is connected between the nodes N1 and N2 to perform a function as a terminator resistor with respect to the transmission paths 1 and 2.

Each of the drivers IN1 and IN2 is a CMOS inverter circuit that outputs an inverted logic of an input signal X. Each of the drivers BU1 and BU2 consists of two CMOS inverter circuits connected in series, and is a buffer circuit for outputting the same logic as that of an input signal X.

Figure 2:
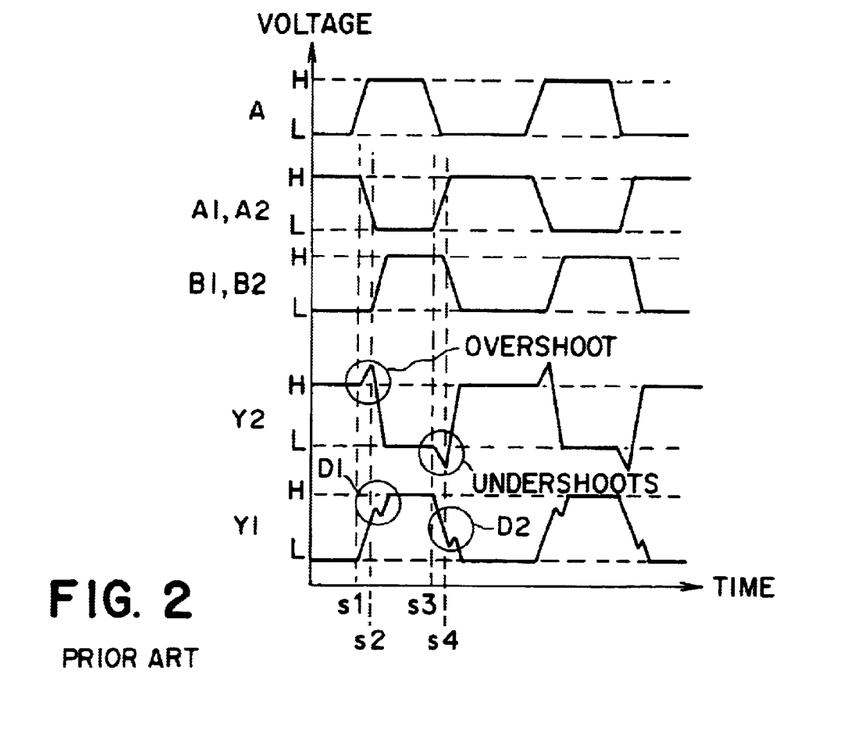
FIG. 2 is a signal waveform diagram showing the operation of the circuit in FIG. 1.

FIG. 2 shows respective waveforms of the control signals A1, A2, B1, and B2 and the output signals Y1 and Y2. Assume that the drivers IN1 and IN2 have changed from an H level to an L level at a time s1 in response to a change of an input signal X from an L level to an H level. Because of the difference of configuration of the drivers BU1 and BU2 from that of the drivers IN1 and IN2, the signals B1 and B2 change from the L level to the H level at a time s2 that is later than the time s1 as shown in FIG. 2.

The MOS transistor M1 changes from an on state to an off state and the MOS transistor M2 changes from an off state to an on state in response to level changes of the signals A1 and A2 at the time s1, respectively, and the voltage on the node N1 then rises from the L level. On the other hand, the MOS transistor M3 remains in the off state and the MOS transistor M4 remains in the on state until the time s2 is reached. Therefore, the potential on the node N2 also rises through the resistor R according to rising of the voltage on the node N1. Subsequently, the MOS transistors M3 and M4 change to the on state and the off state, respectively, in response to level changes of the signals B1 and B2 at the time s2, and the voltage on the node N2 drops. In response to the drop, the voltage on the node N1 momentarily drops through the resistor R, but the node N1 is driven by the MOS transistor M2 to the high voltage again.

When the signals A1 and A2 change from the L level to the H level at a time s3 in response to a change of the input signal X from the H level to the L level, the signals B1 and B2 change from the H level to the L level at a time s4 that is later than the time s3. The MOS transistor M1 changes from the off state to the on state and the MOS transistor M2 changes from the on state to the off state in response to level changes of the signals A1 and A2 at the time s3, and the voltage on the node N1 drops from the H level. On the other hand, the MOS transistor M3 remains in the on state and the MOS transistor M4 remains in the off state until the time s4 is reached. Therefore, the potential on the node N2 also drops through the resistor R according to drop of the voltage on the node N1. The MOS transistor M3 changes to the off state and the MOS transistor M4 changes to the on state in response to level changes of the signals B1 and B2 at the time s4, respectively, and the voltage on the node N2 rises. The voltage on the node N1 momentarily rises through the resistor R according to rising of the voltage on the node N2, but the node N1 is driven by the MOS transistor M1 to the low voltage again.

As explained above, the control signals A1, A2, B1, and B2 are generated so that response of the signals B1 and B2 to the input signal X is delayed as compared to response of the signals A1 and A2. Resultantly, as shown in FIG. 2, an overshoot that momentarily exceeds the voltage at the H level and an undershoot that momentarily drops lower than the voltage at the L level occur in the output signal Y2 in response to logical level changes of the input signal X. Further, a portion D1 that momentarily drops its waveform and a portion D2 that momentarily raises its waveform occur in the output signal Y1. The distortions of these waveforms are caused by occurrence of a period in which both of the MOS transistors M1 and M2 are turned off simultaneously when both of the MOS transistors M3 and M4 are turned on or by occurrence of a period in which both of the MOS transistors M3 and M4 are turned off simultaneously when both of the MOS transistors M1 and M2 are turned on according to level changes of the input signal X.

Such distortions in the output waveforms of the output signals Y1 and Y2 are not merely an apparent problem but become a problem in terms of signal propagation property. For example, although the terminator resistor R is provided, the signals Y1 and Y2 are reflected to a certain extent by the respective ends of the transmission paths 1 and 2. The reflection of the distorted portions of the waveforms causes to further disturb the waveforms of the output signals Y1 and Y2. Accordingly, signals having proper waveforms may not be transferred to their destinations. Further, if there are other transmission paths adjacent to the transmission paths 1 and 2, wiring capacity between the transmission paths 1 and 2 and the adjacent transmission paths may cause so-called cross talk noise that the distortions of these waveforms cause noise to occur on other adjacent transmission paths.

SUMMARY OF THE INVENTION

It is an object of this invention to provide a semiconductor integrated circuit that suppresses waveform distortions of output signals when logical levels of the output signals are changed in accordance with an input signal.

The semiconductor integrated circuit according to one aspect of this invention comprises a first MOS transistor of a first conductivity type having a drain terminal connected to a first node; a second MOS transistor of a second conductivity type different from the first conductivity type, having a drain terminal connected to said first node; a third MOS transistor of the first conductivity type having a drain terminal connected to a second node and a source terminal connected to a source terminal of said first MOS transistor;

a fourth MOS transistor of the second conductivity type having a drain terminal connected to said second node and a source terminal connected to a source terminal of said second MOS transistor; and a driver circuit which generates first to fourth control signals whose logical levels change in response to a common input signal, and applies the signals to respective gate terminals of said first to fourth MOS transistors. In this structure, the first control signal starts to change from a low level to a high level at a first time in response to a first level change of the input signal from a high level to a low level, and starts to change from the high level to the low level at a second time in response to a second level change of the input signal from the low level to the high level. The second control signal starts to change from a low level to a high level at a third time, that is later than the first time, in response to the first level change of the input signal, and starts to change from the high level to the low level at a fourth time, that is earlier than the second time, in response to the second level change of the input signal. The third control signal starts to change from a high level to a low level at a fifth time in response to the first level change of the input signal, and starts to change from the low level to the high level at a sixth time in response to the second level change of the input signal. The fourth control signal starts to change from a high level to a low level at a seventh time, that is earlier than the fifth time, in response to the first level change of the input signal, and starts to change from the low level to the high level at an eighth time, that is later than the sixth time, in response to the second level change of the input signal. Moreover, at least a portion of a period between the first and second times and at least a portion of a period between the fifth and sixth times overlap one another, and at least a portion of a period between the third and fourth times and at least a portion a period between the seventh and eighth times overlap one another.

The semiconductor integrated circuit according to one aspect of this invention comprises a first MOS transistor of a first conductivity type having a drain terminal connected to a first node; a second MOS transistor of a second conductivity type different from said first conductivity type, having a drain terminal connected to said first node; a third MOS transistor of the first conductivity type having a drain terminal connected to a second node and a source terminal connected to a source terminal of said first MOS transistor; a fourth MOS transistor of the second conductivity type having a drain terminal connected to said second node and a source terminal connected to a source terminal of said second MOS transistor; and a driver circuit. This driver circuit generates first and second control signals each of which changes from a low level to a high level in response to a first level change of an input signal from a high level to a low level, and changes from the high level to the low level in response to a second level change of the input signal from the low level to the high level; and third and fourth control signals each of which changes from a high level to a low level in response to the first level change of the input signal, and changes from the low level to the high level in response to the second level change of the input signal. The driver circuit applies the first to fourth control signals to respective gate terminals of said first to fourth MOS transistors. The driver circuit includes at least one first logic circuit consisting of a first delay circuit that is connected to a node whose voltage at its input changes in response to a voltage change of the input signal and delays the voltage change at the input to be output; and a NAND logic gate whose first input is connected to the input of said first delay circuit, and whose second input is connected to the output of said first delay circuit, and which outputs a NAND logic; and at least one second logic circuit consisting of a second delay circuit that is connected to a node whose voltage at its input changes in response to a voltage change of the input signal and delays the voltage change at the input to be output; and a NOR logic gate whose first input is connected to the input of said second delay circuit, and whose second input is connected to the output of said second delay circuit, and which outputs a NOR logic. The driver circuit generates the first to fourth control signals based on the NAND logic output from at least one first logic circuit and the NOR logic output from at least one second logic circuit.

Other objects and features of this invention will become apparent from the following description with reference to the accompanying drawings.

DESCRIPTION OF THE PREFERRED EMBODIMENTS

Embodiments of the method of designing logic circuit and the computer program according to this invention will be explained below with reference to the accompanying drawings.

Figure 3:
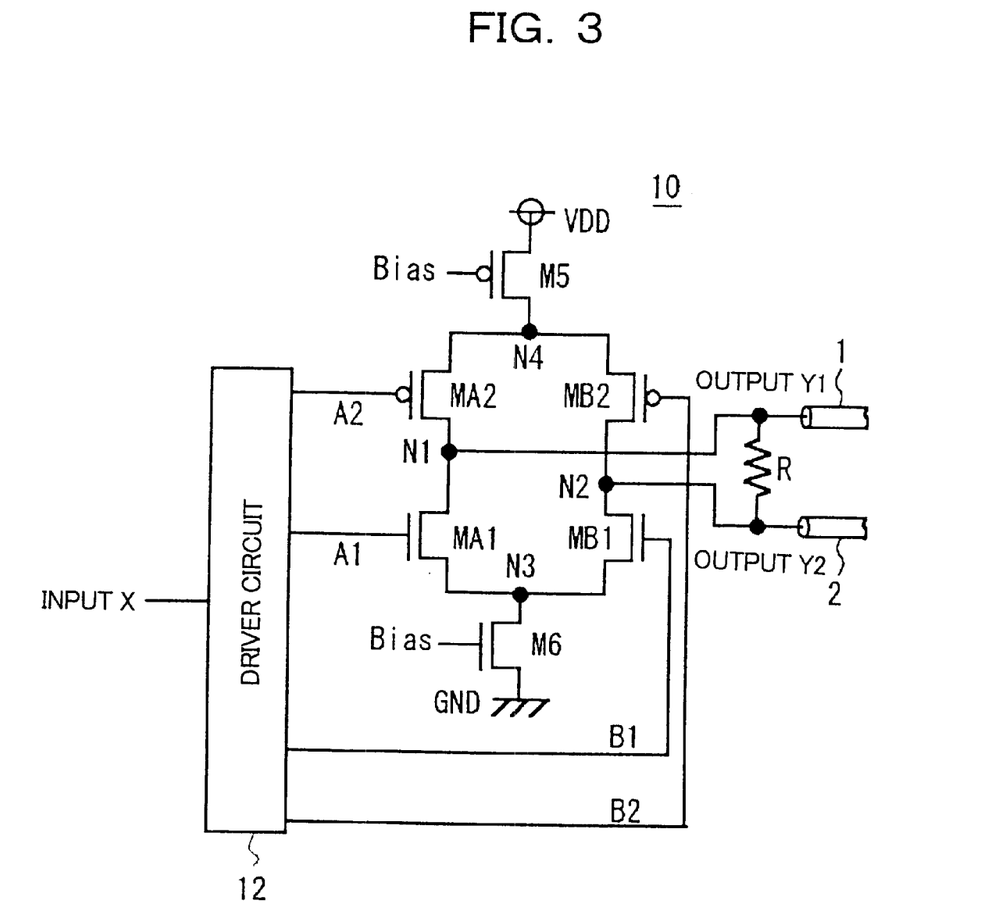
FIG. 3 is a block circuit diagram showing a semiconductor integrated circuit (differential output circuit) according to a first embodiment of this invention.

FIG. 3 shows a configuration of the semiconductor integrated circuit 10 according to a first embodiment of this invention. This semiconductor integrated circuit 10 formed on a single semiconductor chip is a differential output circuit that outputs two logical signals having logical levels in opposite phases to each other from respective nodes N1 and N2 and transfers the signals to circuits of another semiconductor chip through transmission paths 1 and 2. The semiconductor integrated circuit 10 comprises the nMOS transistors MA1, MB1, pMOS transistors MA2, MB2, constant current sources M5, M6, and the resistor R.

The nMOS transistor MA1 has a source terminal connected to a node N3 and a drain terminal connected to the node N1. The nMOS transistor MB1 has a source terminal connected to the node N3 and a drain terminal connected to the node N2. The pMOS transistor MA2 has a source terminal connected to a node N4 and a drain terminal connected to the node N1. The pMOS transistor MB2 has a source terminal connected to the node N4 and a drain terminal connected to the node N2.

The constant current source M5 is formed with a pMOS transistor having a source terminal supplied with a power supply voltage VDD, a drain terminal connected to the node N4, and a gate terminal supplied with a predetermined bias voltage, and supplies a constant current to the node N4. The constant current source M6 is formed with an nMOS transistor having a source terminal supplied with a ground voltage GND (zero volt), a drain terminal connected to the node N3, and a gate terminal supplied with a predetermined bias voltage, and supplies a constant current to the node N3. The constant current sources M5 and M6 adjust the amount of a current flowing between the nodes N3 and N4 and contribute to lower power consumption. Only one of the constant current sources M5 and M6 may be provided, and a power supply voltage or a ground potential may directly be applied to the other one of the nodes N3 and N4 on the side of which the constant current source is not provided.

The resistor R is connected between the node N1 and the node N2 as a terminator resistor of the transmission paths 1 and 2. The resistor R may be disposed outside the chip.

The semiconductor integrated circuit 10 has the driver circuit 12 that generates the control signals A1, A2, B1, and B2 to be applied to respective gate terminals of the MOS transistors MA1, MA2, MB1, and MB2 according to an input signal X. In the driver circuit 12, respective logical levels of the control signals A1 and A2 change from an L level to an H level while respective logical levels of the control signals B1 and B2 change from an H level to an L level according to a change of the input signal X from an H level to an L level. Conversely, the logical levels of the control signals A1 and A2 change from the H level to the L level while the logical levels of the control signals B1 and B2 change from the L level to the H level according to level change of the input signal X from the L level to the H level. The H level here corresponds to the power supply voltage VDD and the L level corresponds to the ground voltage GND (hereinafter the same).

In the first embodiment, the driver circuit 12 controls timings at which the logical levels of the control signals A1, A2, B1, and B2 change so as to generate a period in which all the MOS transistors MA1, MA2, MB1, and MB2 are turned on according to respective changes of the input signal X from the H level to the L level and from the L level to the H level.

Figure 4:
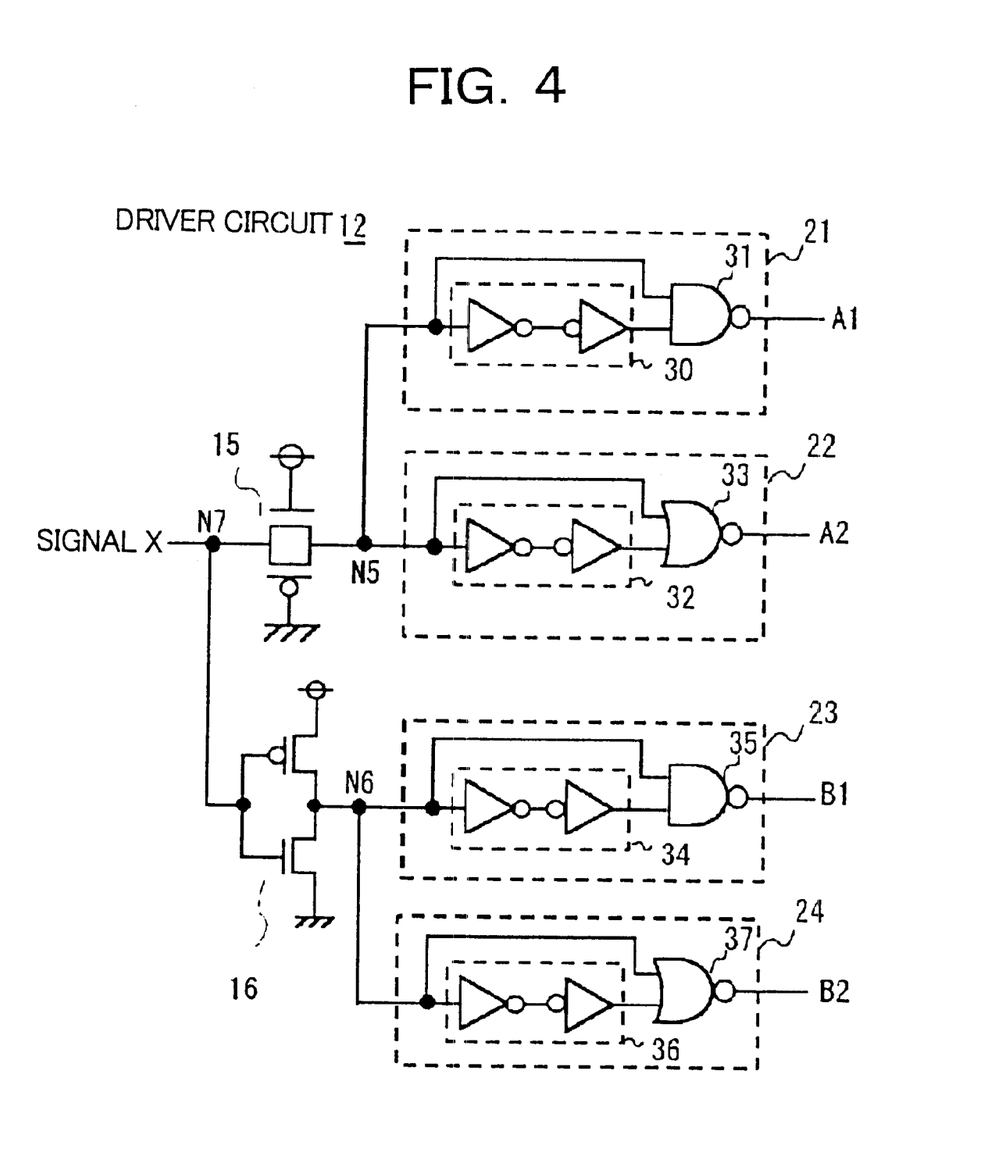
FIG. 4 is a block circuit diagram showing the driver circuit 12 in FIG. 3.

FIG. 4 is a block circuit diagram of the driver circuit 12. The driver circuit 12 has the logic circuits 21 to 24, transfer gate 15, and the CMOS inverter 16.

The inverter 16 consists of a pMOS transistor whose source terminal is supplied with the power supply voltage VDD, drain terminal is connected with the node N6, and gate terminal is supplied with an input signal X on the node N7, and an nMOS transistor whose source terminal is supplied with the ground voltage GND, drain terminal is connected with the node N6, and gate terminal is supplied with the input signal X on the node N7. The inverter 16 then outputs logically inverted signals of the input signal X to the node N6. The transfer gate 15 consists of an nMOS transistor whose gate terminal is supplied with a power supply voltage VDD to conduct at any time and a pMOS transistor whose gate terminal is supplied with a ground voltage GND to conduct at any time. These nMOS transistor and pMOS transistor are connected in parallel between the nodes N5 and N7. The transfer gate 15 receives an input signal X and outputs its logical level without any change to the node N5. However, the change of the logical level on the node N5 occurs with a delay with respect to the logical level change of the input signal X.

The logic circuit 21 outputs the control signal A1 based on a signal on the node N5. More specifically, the logic circuit 21 consists of a delay circuit 30 that delays the signal on the node N5 and a NAND logic gate 31 that outputs a NAND logic of the signal on the node N5 and the signal output of the delay circuit 30. The logic circuit 22 outputs the control signal A2 based on the signal on the node N5. More specifically, the logic circuit 22 consists of a delay circuit 32 that delays the signal on the node N5 and a NOR logic gate 33 that outputs a NOR logic of the signal on the node N5 and the signal output of the delay circuit 32.

The logic circuit 23 outputs the control signal B1 based on a signal on the node N6, and has the same circuit configuration as that of the logic circuit 21. More specifically, the logic circuit 23 consists of a delay circuit 34 that delays the signal on the node N6 and a NAND logic gate 35 that outputs a NAND logic of the signal on the node N6 and the signal output of the delay circuit 34.

The logic circuit 24 outputs the control signal B2 based on the signal on the node N6, and has the same circuit configuration as that of the logic circuit 22. More specifically, the logic circuit 24 consists of a delay circuit 36 that delays the signal on the node N6 and a NOR logic gate 37 that outputs a NOR logic of the signal on the node N6 and the signal output of the delay circuit 36.

Each of the delay circuits 30, 32, 34, and 36 has the same circuit configuration as one another, and is provided with an even number of CMOS inverters (two units in the figure) each the same as the inverter 16, which are cascade-connected. Therefore, the larger number of stages of the inverters makes the delay time longer in each of the delay circuits.

For convenience in design, input may be connected to respective outputs of the logic gates 31, 33, 35, and 37, buffer circuits that buffer signals output of these logic gates may be connected thereto, and outputs of the buffer circuits may be set to the control signals A1, A2, B1, and B2, respectively.

Figure 5:
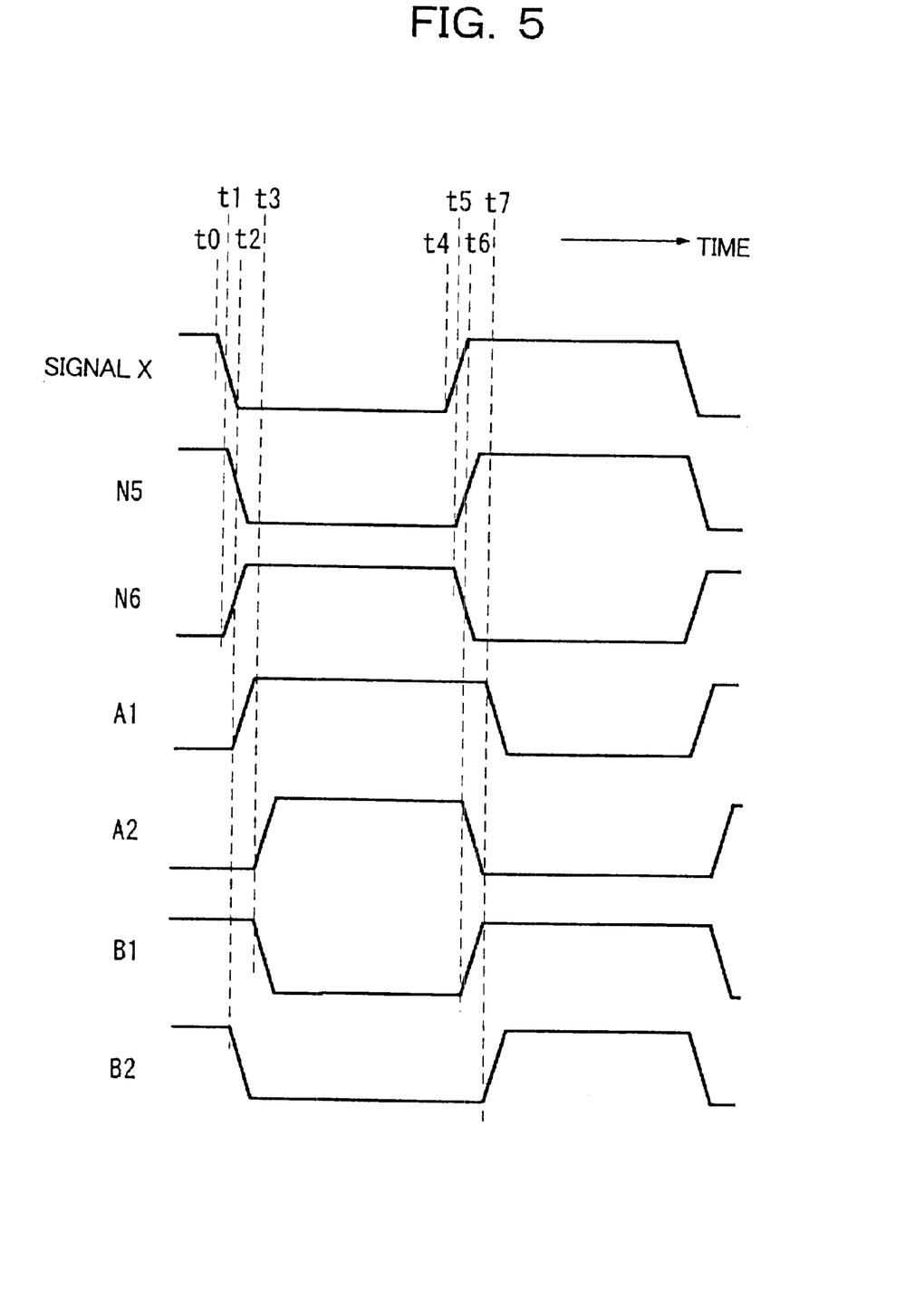
FIG. 5 is a signal waveform diagram showing the operation of the driver circuit 12.

The timing chart in FIG. 5 shows waveforms of the signals on the nodes N5, node N6, and the control signals A1, A2, B1, and B2 with respect to the input signal X. It is assumed here that the input signal X changes from the H level to the L level at a time t0 and changes from the L level to the H level at a time t4.

The signal on the node N6 changes an L level to an H level by the inverter 16 in response to a change of the input signal X from an H level to an L level. The signal on the node N6 starts to change from the L level to the H level at a time t1 (t1>t0) due to a response delay of the inverter 16. On the other hand, a delayed signal of the input signal X by the transfer gate 15 appears on the node N5.

The transfer gate 15 is configured so that a signal delay by the transfer gate 15 becomes substantially equal to a response delay of the inverter 16, and the signal on the node N5 starts to change from the H level to the L level at the time t1.

The control signals A1 and A2 show the L level and the control signals B1 and B2 show the H level until the time t1, respectively. The NAND gate 31 changes the control signal A1 from the L level to the H level in response to a change of the signal on the node N5 from the H level to the L level, but the level of the signal starts to change at a time t2 (t2>t1) due to a response delay of the NAND gate 31. On the other hand, the delay circuit 32 delays the change of the signal on the node N5 from the H level to the L level to apply the delayed signal to the NOR gate 33, therefore, the control signal A2 is still at the L level at the time t2.

The NOR gate 37 changes the control signal B2 from the H level to the L level in response to a change of the signal on the node N6 from the L level to the H level, but the level of the signal starts to change at the time t2 due to a response delay of the NOR gate 37. On the other hand, the delay circuit 34 delays the change of the signal on the node N6 from the L level to the H level to apply the delayed signal to the NAND gate 35, therefore, the control signal B1 is still at the H level at the time t2.

When the delay circuits 32 and 34 apply changes of the levels on the nodes N5 and N6 to the NOR gate 33 and NAND gate 35, respectively, the logical level of the control signal A2 changes from the L level to the H level and the logical level of the control signal B1 changes from the H level to the L level, respectively. Both of the logical levels of the control signals A2 and B1 start to change at a time t3 (t3>t2) due to signal delays of the delay circuits 32 and 34. Time (t3−t2) corresponds to a delay time produced by the delay circuits 32 and 34.

Conversely, the signal on the node N6 changes from the H level to the L level by the inverter 16 in response to a change of the input signal X from the L level to the H level at the time t4. However, the level of the signal starts to change at a time t5 (t5>t4) due to a response delay of the inverter 16. On the other hand, the signal on the node N5 starts to change from the L level to the H level at the time t5 due to a signal delay by the transfer gate 15.

The control signals A1 and A2 are at the H level and the control signals B1 and B2 are at the L level until the time t5. The NOR logic gate 33 changes the control signal A2 from the H level to the L level in response to a change of the signal on the node N5 from the L level to the H level. However, the level of the signal starts to change at a time t6 (t6>t5) due to a response delay of the NOR logic gate 33. On the other hand, the delay circuit 30 delays the change of the signal on the node N5 from the L level to the H level to apply the delayed signal to the NAND logic gate 31, therefore, the control signal A1 is still at the H level at the time t6.

The NAND logic gate 35 changes the control signal B1 from the L level to the H level in response to a change of the signal on the node N6 from the H level to the L level. However, the level of the signal starts to change at the time t6 due to a response delay of the NAND logic gate 35. On the other hand, the delay circuit 36 delays the change of the signal on the node N6 from the H level to the L level to apply the delayed signal to the NOR logic gate 37, therefore, the control signal B2 is still at the L level at the time t6.

When the delay circuits 30 and 36 apply changes of the levels on the nodes N5 and N6 to the NAND gate 31 and NOR gate 37, respectively, the logical level of the control signal A1 changes from the H level to the L level and the logical level of the control signal B2 changes from the L level to the H level, respectively. Both of the logical levels of the control signals A1 and B2 start to change at a time t7 (t7>t6) due to signal delays of the delay circuits 30 and 36. Time (t7−t6) corresponds to a delay time produced by the delay circuits 32 and 34, and has the same length as the time (t3−t2).

Figure 6:
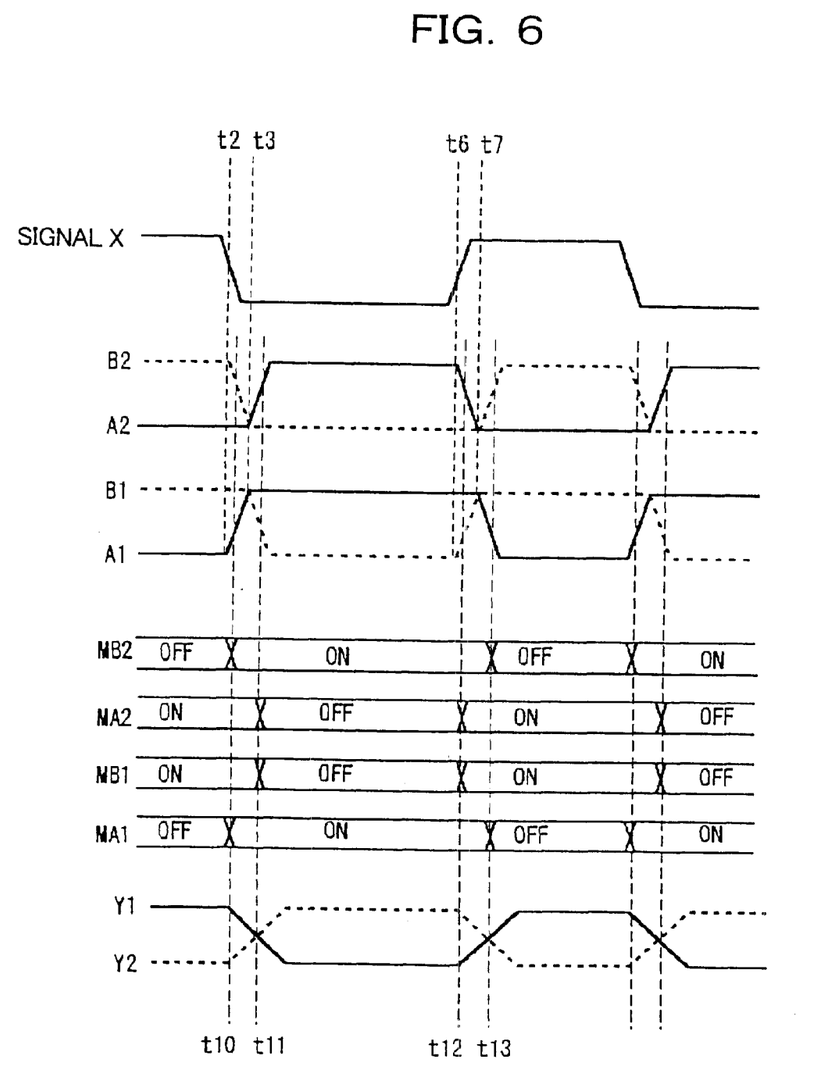
FIG. 6 is a signal waveform diagram showing the operation of the differential output circuit in FIG. 1.

The timing chart in FIG. 6 shows respective ON-OFF transitions of the MOS transistors MA1, MA2, MB1, and MB2 in FIG. 1, and shows waveforms of the output signals Y1 and Y2.

When the control signals A1 and A2 are at the L level and the control signals B1 and B2 are at the H level, the MOS transistors MA1 and MB2 are OFF, while the MOS transistors MA2 and MB1 are ON. At this time, the output signal Y1 is at the H level, while the output signal Y2 is at the L level.

As explained in FIG. 5, the control signal A1 starts to change from the L level to the H level at the time t2 by the driver circuit 12, and at the same time the control signal B2 starts to change from the H level to the L level. The control signal A2 starts to change from the L level to the H level at the time t3 that is later than the time t2, and at the same time the control signal B1 starts to change from the H level to the L level. The MOS transistors MA1 and MB2 are simultaneously shifted from OFF to ON at a time t10 (t10>t2) in response to the control signals A1 and B2. The time t10 corresponds to a point in time at which the voltage at the gate terminal of the MOS transistor MA1 rises by the threshold voltage from the ground voltage and corresponds to a point in time at which the voltage at the gate terminal of the MOS transistor MB2 drops by the threshold voltage from the power supply voltage.

The MOS transistors MA2 and MB1 remain ON, but the MOS transistor MB2 turned-on pulls up the voltage on the node N2 from the L level simultaneously when the MOS transistor MA1 turned-on at the time t10 pulls down the voltage on the node N1 from the H level.

The MOS transistors MA2 and MB1 are simultaneously shifted from ON to OFF at a time t11 (t11>t3>t10) in response to the control signals A2 and B1. The time t11 corresponds to a point in time at which the voltage at the gate terminal of the MOS transistor MA2 drops by the threshold voltage from the power supply voltage and corresponds to a point in time at which the voltage at the gate terminal of the MOS transistor MB1 rises by the threshold voltage from the ground voltage. By turning off the MOS transistors MA2 and MB1, the on-state MOS transistor MA1 pulls down the voltage on the node N1 to the L level and the on-state MOS transistor MB2 pulls up the voltage on the node N2 to the H level.

All the MOS transistors MA1, MA2, MB1, and MB2 are turned on at the time t10 during change of the input signal from the H level to the L level. Therefore, even if the potential on the node N2 rises, this rise does not further push up the potential on the node N1 from the H level through the resistor R. Conversely, even if the potential on the node N1 drops, this drop does not further push down the potential on the node N2 from the L level through the resistor R.

Therefore, the output signal Y1 changes from the H level to the L level without occurrence of an overshoot and the output signal Y2 changes from the L level to the H level without occurrence of an undershoot according to a change of the input signal X from the H level to the L level. Thus, it is possible to suppress waveform distortions of the output signals Y1 and Y2.

Subsequently, the control signal A2 starts to change from the H level to the L level at the time t6, and at the same time the control signal B1 starts to change from the L level to the H level. At a time t7 that is later than the time t6, the control signal A1 starts to change from the H level to the L level, and at the same time the control signal B2 starts to change from the L level to the H level. The MOS transistors MA2 and MB1 are simultaneously shifted from OFF to ON at a time t12 (t12>t6) in response to the control signals A2 and B1. The time t12 corresponds to a point in time at which the voltage at the gate terminal of the MOS transistor MA2 rises by the threshold voltage from the ground voltage and corresponds to a point in time at which the voltage at the gate terminal of the MOS transistor MB1 drops by the threshold voltage from the power supply voltage.

The MOS transistors MA1 and MB2 remain ON, but the MOS transistor MB1 turned-on pulls down the voltage on the node N2 from the H level simultaneously when the MOS transistor MA2 turned-on pulls up the voltage on the node N1 from the L level at the time t12.

The MOS transistors MA1 and MB2 are simultaneously shifted from ON to OFF at a time t13 (t13>t7>t12) in response to the control signals A1 and B2. The time t13 corresponds to a point in time at which the voltage at the gate terminal of the MOS transistor MB2 drops by the threshold voltage from the power supply voltage and corresponds to a point in time at which the voltage at the gate terminal of the MOS transistor MA1 rises by the threshold voltage from the ground voltage. By turning off the MOS transistors MA1 and MB2, the on-state MOS transistor MA2 pulls up the voltage on the node N1 to the H level and the on-state MOS transistor MB1 pulls down the voltage on the node N2 to the L level.

All the MOS transistors MA1, MA2, MB1, and MB2 are turned on at the time t12 during change of the input signal from the L level to the H level. Therefore, even if the potential on the node N2 drops, this drop does not further push down the potential on the node N1 from the L level through the resistor R. Conversely, even if the potential on the node N1 rises, this rise does not further push up the potential on the node N2 from the H level through the resistor R.

Therefore, the output signal Y1 changes from the L level to the H level without occurrence of an undershoot and the output signal Y2 changes from the H level to the L level without occurrence of an overshoot according to a change of the input signal X from the L level to the H level. Thus, it is possible to suppress waveform distortions of the output signals Y1 and Y2.

As explained above, according to the first embodiment, the control signals A1, A2, B1, and B2 are generated so that all the MOS transistors MA1, MA2, MB1, and MB2 are turned on according to level change of the signal X. This works so as to suppress an overshoot and an undershoot occurring in the output signals Y1 and Y2 without generation of a period in which only the MOS transistors MA1 and MB1 are turned on or only the MOS transistors MA2 and MB2 are turned on. It is therefore possible to avoid waveform distortions such as overshoots and undershoots, which have been seen in the conventional art.

In the first embodiment, the output signals of the logic circuits 21, 22, 23, and 24 in FIG. 4 may be changed so as to be applied to respective gate terminals of the MOS transistors MA2, MA1, MB2, and MB1. In this case, there occurs a period in which all the MOS transistors MA1, MA2, MB1, and MB2 are turned off even in either of changes of the signal X from the L level to the H level and from the H level to the L level. For example, it is assumed that the MOS transistors MA1 and MB2 are ON, the MOS transistors MA2 and MB1 are ON, and the nodes N1 and N2 are at the L level and the H level, respectively. When the logical level of the input signal X changes, all of the four MOS transistors are turned off. This situation does not bring about such a state that only the MOS transistors MB1 and MB2 are turned on or only the MOS transistors MA1 and MA2 are turned on, so that waveform distortions, which have been seen in the conventional art, can be avoided. However, when all the MOS transistors MA1, MA2, MB1, and MB2 are turned on, the nodes N1 and N2 are brought to a floating state. In this case, attention must be paid to the possibility that noise may occur due to external factors.

Further, it is preferable that a delay by the transfer gate 15 coincides with a response delay of the inverter 16. If there is no coincidence between the delays, respective timings of level changes between the control signals A1 and B2 and timings of level changes between the control signals A2 and B1 do not coincide with each other. However, the delay by the transfer gate 15 and the response delay of the inverter 16 may be allowed to differ from each other to the extent of insuring two cases as follows. (1) To overlap, on a time basis, between a portion of a period from the time at which the control signal A1 starts to change from the L level to the H level until the time at which the control signal A2 starts to change from the L level to the H level, and a portion of a period from the time at which the control signal B2 starts to change from the H level to the L level until the time at which the control signal B1 starts to change from the H level to the L level. (2) To overlap, on a time basis, between a portion of a period from the time at which the control signal A2 starts to change from the H level to the L level until the time at which the control signal A1 starts to change from the H level to the L level, and a portion of a period from the time at which the control signal B1 starts to change from the L level to the H level until the time at which the control signal B2 starts to change from the L level to the H level.

Even in this case, a period in which the MOS transistors MA1, MA2, MB1, and MB2 are simultaneously turned on occurs in association with logical level changes of the input signal X. However, it is possible to avoid the state where only the MOS transistors MA1 and MA2 are turned on or only the MOS transistors MB1 and MB2 are turned on, which has occurred in the conventional art. Accordingly, overshoots and undershoots or the like on the output signals Y1 and Y2 can be suppressed to some extent as compared to the conventional art, thus reducing waveform distortions of the output signals.

Figure 7:
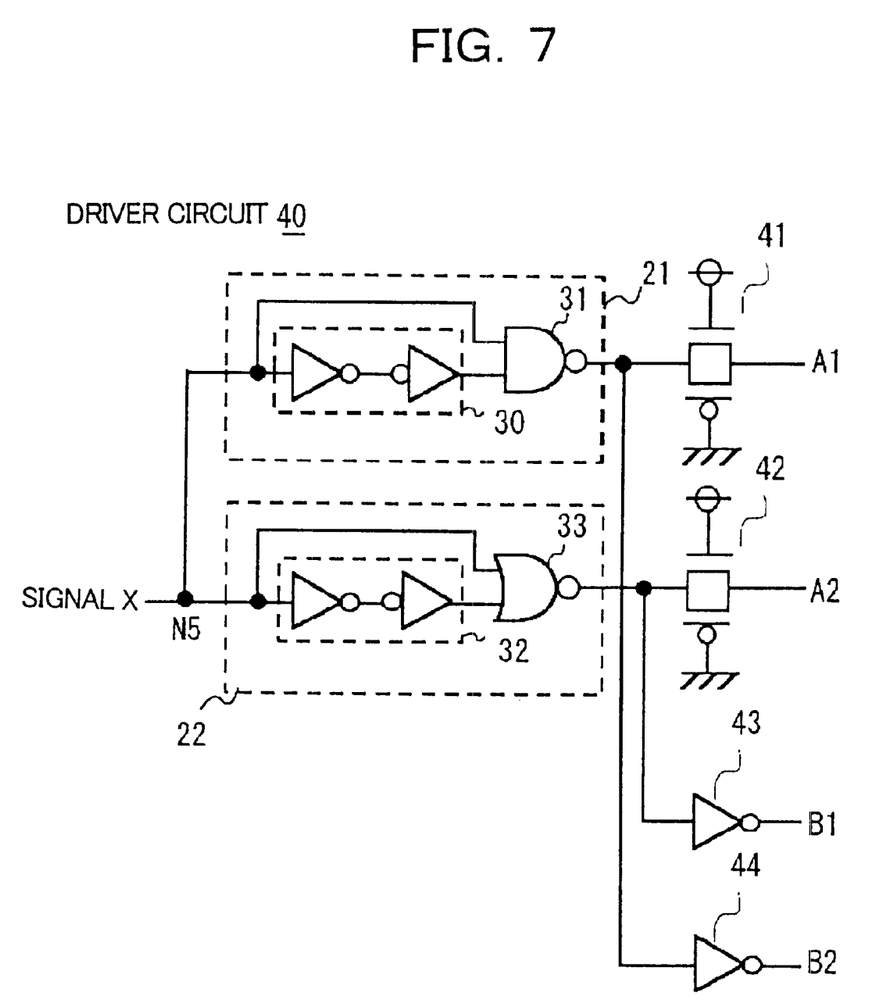
FIG. 7 is a block circuit diagram showing a driver circuit 40 according to a second embodiment of this invention.

The block circuit diagram in FIG. 7 shows another driver circuit 40 applied instead of the driver circuit 12 in FIG. 3. The driver circuit 40 comprises the logic circuits 21 and 22 each having the same configuration as that of FIG. 4 (although the input signal X is applied to the node N5), transfer gate 41 that receives a signal output of the NAND logic gate 31 to its input and outputs a control signal A1 from its output, transfer gate 42 that receives a signal output of the NOR logic gate 33 to its input and outputs a control signal A2 from its output, CMOS inverter 44 that receives a signal output of the NAND logic gate 31 to its input and outputs a control signal B2 from its output, and the CMOS inverter 43 that receives a signal output of the NOR logic gate 33 to its input and outputs a control signal B1 from its output.

The CMOS inverters 43 and 44 have the same configuration as that of the inverter 16 in FIG. 4, and the transfer gates 41 and 42 have the same configuration as that of the transfer gate 15 in FIG. 4.

In the driver circuit 40, in response to a change of an input signal X from the H level to the L level in the same manner as that of FIG. 4, the control signal A1 changes from an L level to an H level at a first time, while the control signal A2 changes from an L level to an H level at a second time, that is later than the first time. Further, the control signal B2 changes from an H level to an L level at a third time the same as the first time, while the control signal B1 changes from an H level to an L level at a fourth time the same as the second time, that is later than the third time. A period between the first time and the second time and a period between the third time and the fourth time overlap one another.

In response to a change of the input signal X from the L level to the H level, the control signal A2 changes from the H level to the L level at a fifth time, while the control signal A1 changes from the H level to the L level at a sixth time, that is later than the fifth time. Further, the control signal B1 changes from the L level to the H level at a seventh time the same as the fifth time, while the control signal B2 changes from the L level to the H level at an eighth time the same as the sixth time, that is later than the seventh time. A period between the fifth time and the sixth time and a period between the seventh time and the eighth time overlap one another.

For convenience in design, input may be connected to respective outputs of the transfer gates 41, 42 and the inverters 43, 44, buffer circuits that buffer signals output of these inverters may be connected thereto, and outputs of these buffer circuits may be set to the control signals A1, A2, B1, and B2, respectively.

In the driver circuit 40, the output signals Y1 and Y2 do not bring about an overshoot and an undershoot even if the logical level of the input signal X changes like the first embodiment. The driver circuit 40 is formed with a smaller number of transistors as compared to the driver circuit 12. Each of the NAND logic gate and the NOR logic gate is generally formed with two nMOS transistors and two pMOS transistors, respectively. Therefore, the driver circuit 40 is generally formed with the number of transistors smaller by 24 pieces in total of 12 pieces of the pMOS transistors and 12 pieces of nMOS transistors as compared to those of the driver circuit 12.

This invention provides the semiconductor integrated circuit comprising the first MOS transistor of the first conductivity type having the drain terminal connected to the first node; the second MOS transistor of the second conductivity type having the drain terminal connected to the first node different from the first conductivity type; the third MOS transistor of the first conductivity type having the drain terminal connected to the second node and the source terminal connected to the source terminal of the first MOS transistor; and the fourth MOS transistor of the second conductivity type having the drain terminal connected to the second node and the source terminal connected to the source terminal of the second MOS transistor. In this semiconductor integrated circuit, control signals applied to the respective gate terminals of the first to fourth MOS transistors generate a period in which all the first to fourth MOS transistors are turned on or off in response to logical level changes of the input signal. Therefore, occurrence of overshoots and undershoots on the first and second nodes can be suppressed, which makes it possible to suppress waveform distortions of signals output from the first and second nodes.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor integrated circuit comprising:
   a first MOS transistor of a first conductivity type having a drain terminal connected to a first node;
   a second MOS transistor of a second conductivity type different from the first conductivity type, having a drain terminal connected to said first node;
   a third MOS transistor of the first conductivity type having a drain terminal connected to a second node and a source terminal connected to a source terminal of said first MOS transistor;
   a fourth MOS transistor of the second conductivity type having a drain terminal connected to said second node and a source terminal connected to a source terminal of said second MOS transistor; and
   a driver circuit which generates first to fourth control signals whose logical levels change in response to a common input signal, and applies the signals to respective gate terminals of said first to fourth MOS transistors, wherein
   the first control signal starts to change from a low level to a high level at a first time in response to a first level change of the input signal from a high level to a low level, and starts to change from the high level to the low level at a second time in response to a second level change of the input signal from the low level to the high level;
   the second control signal starts to change from a low level to a high level at a third time, that is later than the first time, in response to the first level change of the input signal, and starts to change from the high level to the low level at a fourth time, that is earlier than the second time, in response to the second level change of the input signal;
   the third control signal starts to change from a high level to a low level at a fifth time in response to the first level change of the input signal, and starts to change from the low level to the high level at a sixth time in response to the second level change of the input signal;
   the fourth control signal starts to change from a high level to a low level at a seventh time, that is earlier than the fifth time, in response to the first level change of the input signal, and starts to change from the low level to the high level at an eighth time, that is later than the sixth time, in response to the second level change of the input signal; and
   at least a portion of a period between the first and second times and at least a portion of a period between the fifth and sixth times overlap one another, and at least a portion of a period between the third and fourth times and at least a portion a period between the seventh and eighth times overlap one another.

2. The semiconductor integrated circuit according to claim 1, wherein the first, second, third, and fourth times substantially coincide with the seventh, eighth, fifth, and sixth times, respectively.

3. The semiconductor integrated circuit according to claim 1, wherein said first and second MOS transistors are n-channel MOS transistors, and said third and fourth MOS transistors are p-channel MOS transistors.

4. The semiconductor integrated circuit according to claim 1, wherein a resistor is connected between said first and second nodes.

5. A semiconductor integrated circuit comprising:
   a first MOS transistor of a first conductivity type having a drain terminal connected to a first node;
   a second MOS transistor of a second conductivity type different from said first conductivity type, having a drain terminal connected to said first node;
   a third MOS transistor of the first conductivity type having a drain terminal connected to a second node and a source terminal connected to a source terminal of said first MOS transistor;
   a fourth MOS transistor of the second conductivity type having a drain terminal connected to said second node and a source terminal connected to a source terminal of said second MOS transistor; and
   a driver circuit, which generates
      first and second control signals each of which changes from a low level to a high level in response to a first level change of an input signal from a high level to a low level, and changes from the high level to the low level in response to a second level change of the input signal from the low level to the high level, and third and fourth control signals each of which changes from a high level to a low level in response to the first level change of the input signal, and changes from the low level to the high level in response to the second level change of the input signal, and said driver circuit applies the first to fourth control signals to respective gate terminals of said first to fourth MOS transistors, wherein said driver circuit includes     at least one first logic circuit consisting of a first delay circuit that is connected to a node whose voltage at its input changes in response to a voltage change of the input signal and delays the voltage change at the input to be output; and a NAND logic gate whose first input is connected to the input of said first delay circuit, and whose second input is connected to the output of said first delay circuit, and which outputs a NAND logic; and     at least one second logic circuit consisting of a second delay circuit that is connected to a node whose voltage at its input changes in response to a voltage change of the input signal and delays the voltage change at the input to be output; and a NOR logic gate whose first input is connected to the input of said second delay circuit, and whose second input is connected to the output of said second delay circuit, and which outputs a NOR logic, wherein said driver circuit generates the first to fourth control signals based on the NAND logic output from at least one first logic circuit and the NOR logic output from at least one second logic circuit.

6. The semiconductor integrated circuit according to claim 5, wherein said driver circuit further comprises:

an inverter circuit that receives the input signal and outputs an inverted signal of the received signal; and a transfer gate that receives the input signal and outputs the signal; and     a pair of first logic circuits and a pair of second logic circuits, wherein         the output of said inverter circuit is connected to the input of a first delay circuit of one of said two first logic circuits and the input of a second delay circuit of one of said two second logic circuits, and         the output of said transfer gate is connected to the input of a first delay circuit of the other one of said two first logic circuits and the input of a second delay circuit of the other one of said two second logic circuits.

7. The semiconductor integrated circuit according to claim 5, wherein a resistor is connected between said first and second nodes.

\* \* \* \* \*